(12) United States Patent
Takagi

(10) Patent No.: US 8,013,927 B2
(45) Date of Patent: Sep. 6, 2011

(54) SOLID-STATE IMAGE SENSORS

(75) Inventor: Toru Takagi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 386 days.

(21) Appl. No.: 11/922,768

(22) PCT Filed: May 17, 2006

(86) PCT No.: PCT/JP2006/309799
§ 371 (c)(1),
(2), (4) Date: Dec. 19, 2007

(87) PCT Pub. No.: WO2007/007467
PCT Pub. Date: Jan. 18, 2007

(65) Prior Publication Data
US 2009/0225205 A1    Sep. 10, 2009

(30) Foreign Application Priority Data
Jul. 8, 2005  (JP) .................... 2005-200296

(51) Int. Cl.
*H04N 5/225*  (2006.01)
*G02B 13/16*  (2006.01)
*H01L 21/00*  (2006.01)
*H01L 31/0232*  (2006.01)

(52) U.S. Cl. .......... 348/340; 348/335; 438/69; 257/432; 257/436

(58) Field of Classification Search .................. 348/335, 348/340; 257/432, 436; 438/69
See application file for complete search history.

(56) References Cited

U.S. PATENT DOCUMENTS

| 4,694,185 | A | * | 9/1987 | Weiss .................. 250/208.1 |
| 5,306,906 | A |   | 4/1994 | Aoki et al. |
| 5,321,297 | A |   | 6/1994 | Enomoto |
| 5,371,397 | A | * | 12/1994 | Maegawa et al. ............. 257/432 |
| 5,471,515 | A |   | 11/1995 | Fossum et al. |
| 5,793,322 | A |   | 8/1998 | Fossum et al. |

(Continued)

FOREIGN PATENT DOCUMENTS

JP    60-059752    4/1985

(Continued)

OTHER PUBLICATIONS

International Preliminary Report on Patentability (Chapter I of the Patent Cooperation Treaty) for PCT/JP2006/309799; mailed Jan. 17, 2008.

*Primary Examiner* — Sinh Tran
*Assistant Examiner* — Mark Monk
(74) *Attorney, Agent, or Firm* — Klarquist Sparkman, LLP (57) ABSTRACT

Solid-state image sensors are disclosed that include one or more pixels formed on a semiconductor substrate. Each pixel includes a photoelectric converter to convert light to an electric signal, and a microlens above the photoelectric converter. The microlens has a plan profile in which the direct distance from a center to a lens edge is variable. The microlens has first base regions and second base regions not including the first base regions. The first base regions are provided near n positions (n being a natural number) of the lens edge from which the direct distance is relatively long. The vertical height of the first base regions from an upper surface of the photoelectric converter is less than the vertical height of the second base regions from the upper surface of the photoelectric converter.

9 Claims, 11 Drawing Sheets

U.S. PATENT DOCUMENTS

| | | |
|---|---|---|
| 5,841,126 A | 11/1998 | Fossum et al. |
| 5,880,691 A | 3/1999 | Fossum et al. |
| 5,886,659 A | 3/1999 | Pain et al. |
| 5,887,049 A | 3/1999 | Fossum |
| 5,903,039 A * | 5/1999 | Bohn ............................ 257/432 |
| 5,909,026 A | 6/1999 | Zhou et al. |
| 5,929,800 A | 7/1999 | Zhou et al. |
| 5,949,483 A | 9/1999 | Fossum et al. |
| 5,952,645 A | 9/1999 | Wang et al. |
| 5,990,506 A | 11/1999 | Fossum et al. |
| 6,021,172 A | 2/2000 | Fossum et al. |
| 6,057,539 A | 5/2000 | Zhou et al. |
| 6,093,582 A * | 7/2000 | Shim ............................... 438/69 |
| 6,101,232 A | 8/2000 | Fossum et al. |
| 6,107,618 A | 8/2000 | Fossum et al. |
| 6,107,619 A | 8/2000 | Cunningham et al. |
| 6,115,065 A | 9/2000 | Yadid-Pecht et al. |
| 6,124,819 A | 9/2000 | Zhou et al. |
| 6,166,768 A | 12/2000 | Fossum et al. |
| 6,171,885 B1 * | 1/2001 | Fan et al. ......................... 438/70 |
| 6,175,383 B1 | 1/2001 | Yadid-Pecht et al. |
| 6,326,230 B1 | 12/2001 | Pain et al. |
| 6,346,700 B1 | 2/2002 | Cunningham et al. |
| 6,373,050 B1 | 4/2002 | Pain et al. |
| 6,380,572 B1 | 4/2002 | Pain et al. |
| 6,384,413 B1 | 5/2002 | Pain |
| 6,400,824 B1 | 6/2002 | Mansoorian et al. |
| 6,403,963 B1 | 6/2002 | Nikzad et al. |
| 6,456,326 B2 | 9/2002 | Fossum et al. |
| 6,476,860 B1 | 11/2002 | Yadid-Pecht et al. |
| 6,486,503 B1 | 11/2002 | Fossum |
| 6,515,702 B1 | 2/2003 | Yadid-Pecht et al. |
| 6,519,371 B1 | 2/2003 | Pain et al. |
| 6,546,148 B1 | 4/2003 | Yadid-Pecht et al. |
| 6,549,235 B1 | 4/2003 | Fossum et al. |
| 6,555,842 B1 | 4/2003 | Fossum et al. |
| 6,570,617 B2 | 5/2003 | Fossum et al. |
| 6,606,122 B1 | 8/2003 | Shaw et al. |
| 6,665,013 B1 | 12/2003 | Fossum et al. |
| 6,721,464 B2 | 4/2004 | Pain et al. |
| 6,744,068 B2 | 6/2004 | Fossum et al. |
| 6,787,749 B1 | 9/2004 | Zhou et al. |
| 6,801,258 B1 | 10/2004 | Pain et al. |
| 6,825,059 B2 | 11/2004 | Fossum |
| 6,838,301 B2 | 1/2005 | Zheng et al. |
| 6,839,452 B1 | 1/2005 | Yang et al. |
| 6,933,488 B2 | 8/2005 | Pain |
| 6,943,838 B2 | 9/2005 | Fossum et al. |
| 6,944,352 B1 | 9/2005 | Yadid-Pecht et al. |
| 6,980,230 B2 | 12/2005 | Yadid-Pecht et al. |
| 7,002,626 B2 | 2/2006 | Pain et al. |
| 7,019,345 B2 | 3/2006 | Pain et al. |
| 7,019,373 B2 * | 3/2006 | Hashimoto .................. 257/432 |
| 7,053,929 B2 | 5/2006 | Yadid-Pecht et al. |
| 7,064,405 B2 * | 6/2006 | Kondo et al. ................. 257/436 |
| 7,105,371 B2 | 9/2006 | Fossum et al. |
| 7,190,398 B2 | 3/2007 | Yadid-Pecht et al. |
| 7,268,814 B1 | 9/2007 | Pain et al. |
| 7,291,826 B2 * | 11/2007 | Vaillant ...................... 250/214.1 |
| 7,369,166 B2 | 5/2008 | Fossum et al. |
| 7,443,005 B2 * | 10/2008 | Kuo et al. ..................... 257/432 |
| 7,453,109 B2 * | 11/2008 | Koizumi et al. .............. 257/291 |
| 7,491,923 B2 * | 2/2009 | Tani ........................... 250/208.1 |
| 2001/0009442 A1 * | 7/2001 | Fukuyoshi et al. ........... 348/335 |
| 2004/0257460 A1 * | 12/2004 | Kuriyama .................... 348/340 |
| 2006/0103941 A1 | 5/2006 | Yamaguchi et al. |

FOREIGN PATENT DOCUMENTS

| | | |
|---|---|---|
| JP | 2000-39503 | 2/2000 |
| JP | 2000-162406 | 6/2000 |
| JP | 2003-172804 | 6/2003 |

* cited by examiner

SOLID-STATE IMAGE SENSORS

CROSS-REFERENCE TO RELATED APPLICATIONS

This application is a U.S. National Stage application claiming priority to, and the benefit of, prior-filed International Application No. PCT/JP2006/309799, filed on May 17, 2006, which claims a priority date of Jul. 8, 2005, based on prior-filed Japan Application No. 2005-200296, the entire contents of which are incorporated herein by reference in their respective entireties.

TECHNICAL FIELD

This disclosure is directed to, inter alia, solid-state image sensors that include a microlens.

BACKGROUND ART

In recent years, video cameras and electronic cameras using solid-state image sensors of CCD (Charge Coupled Device) type, CMOS (Complementary Metal Oxide Semiconductor) type, and the like are in wide use. In the solid-state image sensor, multiple pixels are arranged in a matrix. Each pixel of the solid-state image sensor has a photoelectric converter that converts light received by the pixel to an electric signal. Signal lines, etc., through which the electric signals of the photoelectric converters of the respective pixels are read, are arranged around the photoelectric converters. Light entering from a subject via a lens of a video camera or an electronic camera comprising a solid-state image sensor is imaged on the pixel array. The imaged light is converted to the electric signals by the photoelectric converters.

Not all the light imaged on the pixels necessarily enters the photoelectric converters. To improve light collection, microlenses are arranged in a matrix on the side where light enters the pixels. Light that otherwise would be useless is condensed in the photoelectric converters by the microlenses. See Japan Unexamined Patent Publication No. Sho 60-59752.

A conventional microlens is semispherical and its plan profile is circular, whereas the plan profile of a pixel is generally quadrangular. Thus, the respective profiles of the pixel and of the microlenses do not match each other, resulting in incomplete convergence of light on the photoelectric converters. One approach to preventing this problem is discussed in Japan Unexamined Patent Publication No. Hei 5-326913, in which the plan profile of the microlens is made quadrangular or the plan profiles of the pixel and of the microlenses are made polygonal.

SUMMARY

Problems to be Solved

In a solid-state image sensor having pixels and respective microlenses, there has been a problem that it is difficult for the microlenses to condense light fully and efficiently on the photoelectric converters of the pixels. This is because, generally, the plan profile of a pixel of the solid-state image sensor is quadrangular, whereas the plan profile of the microlens is circular. To solve this problem, there has been considered a method to make both the pixel and the plan profile of the microlens polygonal, but these shapes are not easy to design and manufacture. There is also a problem in that the efficiency by which light is converged on the photoelectric converter is not necessarily improved simply by making the plan profile of the microlens quadrangular.

Figure 13A:
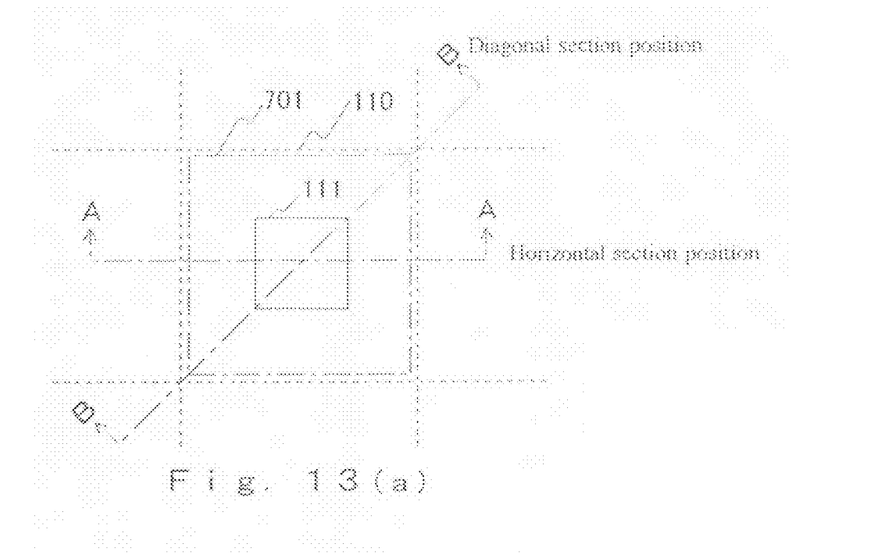
FIG. 13(a) is a plan view of a pixel unit in a conventional solid-state image sensor.
Figure 13B:
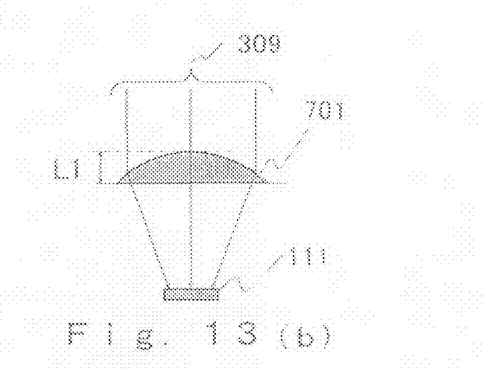
FIGS. 13(b)-13(c) are respective diagrams of the optical convergence behavior, along the sections A-A and B-B, respectively, of FIG. 13(a), of the conventional pixel of FIG. 13(a).
Figure 13C:
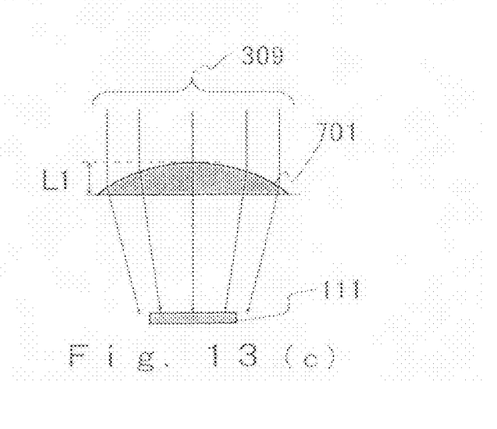

This problem of the conventional art is described with reference to FIGS. 13(a)-13(c). FIG. 13(a) is a plan view (view from above) of a typical pixel of a solid-state image sensor. Item 701 is a conventional quadrangular microlens, item 111 is a photoelectric converter such as a photodiode, item 110 is the pixel, which is one of multiple pixels arranged in a matrix. A-A is a horizontal section connecting centers of opposed sides of the pixel 110 and cutting the pixel 110 in a horizontal direction, and B-B is a diagonal section cutting the pixel 110 in a diagonal direction. FIGS. 13(b) and 13(c) are the sectional views along A-A and B-B, respectively, depicting sectional shapes of the microlens 701 and of the photoelectric converter 111. Also shown are rays denoting optical condensing (optical convergence) being performed by the microlens. Rays 309 denote incoming light, and L1 denotes the thickness of the microlens 701.

Since the diagonal length is greater than the length of a side of the photoelectric converter 111, the diagonal section (along the line B-B) of the microlens 701 in FIG. 13(c) is longer than the horizontal section (along the line A-A) of the microlens 701 shown in FIG. 13(b).

To condense light on the photoelectric converter 111 by the horizontal section of the microlens 701 shown in FIG. 13(b) without changing the thickness L1 of the lens, the curvature radius of the microlens 701 in FIG. 13(c) is larger than in FIG. 13(b). This makes it difficult to condense all the incoming light on the photoelectric converter 111.

The problem with the art summarized above is that it is not possible to improve the efficiency of light convergence on the photoelectric converter 111 simply by making the plan profile of the microlens 701 quadrangular to match the quadrangular plan profile of the pixel 110 of the solid-state image sensor.

Hence, one object of the invention is to provide solid-state image sensors that exhibit good focusing efficiency on the photoelectric converters 111, even when the plan profile of the pixels 110 is quadrangular.

Means for Solving the Problems

An embodiment of a solid-state image sensor according to the invention comprises a pixel formed on a semiconductor substrate, a photoelectric converter, and a microlens. The photoelectric converter serves to convert incident light to a corresponding electric signal. The microlens is situated above the photoelectric converter. The microlens has a plan profile, in which the direct distance from the center of the microlens to the lens edge is variable. The microlens has first base regions and second base regions not including the first base regions. The first base regions are situated near n positions (wherein n is a natural number) of the microlens edge, from which the direct distance is relatively long. The vertical height of the first base regions from the upper surface of the photoelectric converter is lower than the vertical height of the second base regions from the upper surface of the photoelectric converter.

Another embodiment of a solid-state image sensor comprises a pixel formed on a semiconductor substrate, a photoelectric converter, a planarizing layer, and a microlens. The photoelectric converter serves to convert incident light to a corresponding electric signal. The planarizing layer is situated above the photoelectric converter, and the microlens is situated on the planarizing layer. The microlens has a plan profile, in which the direct distance from the center of the microlens to the lens edge is variable. The planarizing layer has first regions and second regions not including the first regions. The first regions are situated near n (wherein n is a natural number) positions of the microlens edge, from which the direct distance is relatively long, in the plan profile of the microlens as vertically projected on the planarizing layer. The thickness of the planarizing layer is greater in the second regions toward a microlens side than in the first regions.

Yet another embodiment of a solid-state image sensor comprises a pixel formed on a semiconductor substrate, a photoelectric converter, and a microlens. The photoelectric converter serves to convert incident light to a corresponding electric signal. The microlens is situated above the photoelectric converter. The microlens has a plan profile, in which the direct distance from the center to the microlens edge is variable. The microlens has first regions and second regions not including the first regions. The first regions are situated near n (wherein n is a natural number) positions of the microlens edge, from which the direct distance is relatively long. The difference between the maximum film thickness and a first minimum film thickness is larger than the difference between the maximum film thickness and a second minimum film thickness. The maximum film thickness is defined as the greatest lens thickness near the center of the microlens. The first minimum film thickness is defined as the smallest lens thickness in the first regions, and the second minimum film thickness is defined as the smallest lens thickness in the second regions.

Yet another embodiment of a solid-state image sensor comprises a pixel formed on a semiconductor substrate, a photoelectric converter, a planarizing layer, and a microlens. The photoelectric converter serves to convert incident light to a corresponding electric signal. The planarizing layer is situated above the photoelectric converter. The microlens is situated on the planarizing layer. In the planarizing layer a second lens is provided that is substantially parallel to the photoelectric converter. The second lens has an optical axis that is aligned with the optical axis of the microlens. The second lens has a plan profile, wherein the direct distance from the center to the lens edge is variable and is made of a material having a greater refractive index than the planarizing layer.

Effect

With solid-state image sensors as disclosed herein, if the shape of a pixel thereof is quadrangular, the focusing efficiency in the four corners of the pixel is improved over the focusing efficiency exhibited by conventional image sensors. Thus, it is possible to obtain good focusing efficiency. Also, compared to a conventional sensor exposed to the same amount of light, an image sensor as disclosed herein produces an increased signal output from the photoelectric converter. Thus, compared to conventional devices, the sensitivity of the subject solid-state image sensor is improved.

DETAILED DESCRIPTION OF THE EMBODIMENTS

First Embodiment

Figure 1:
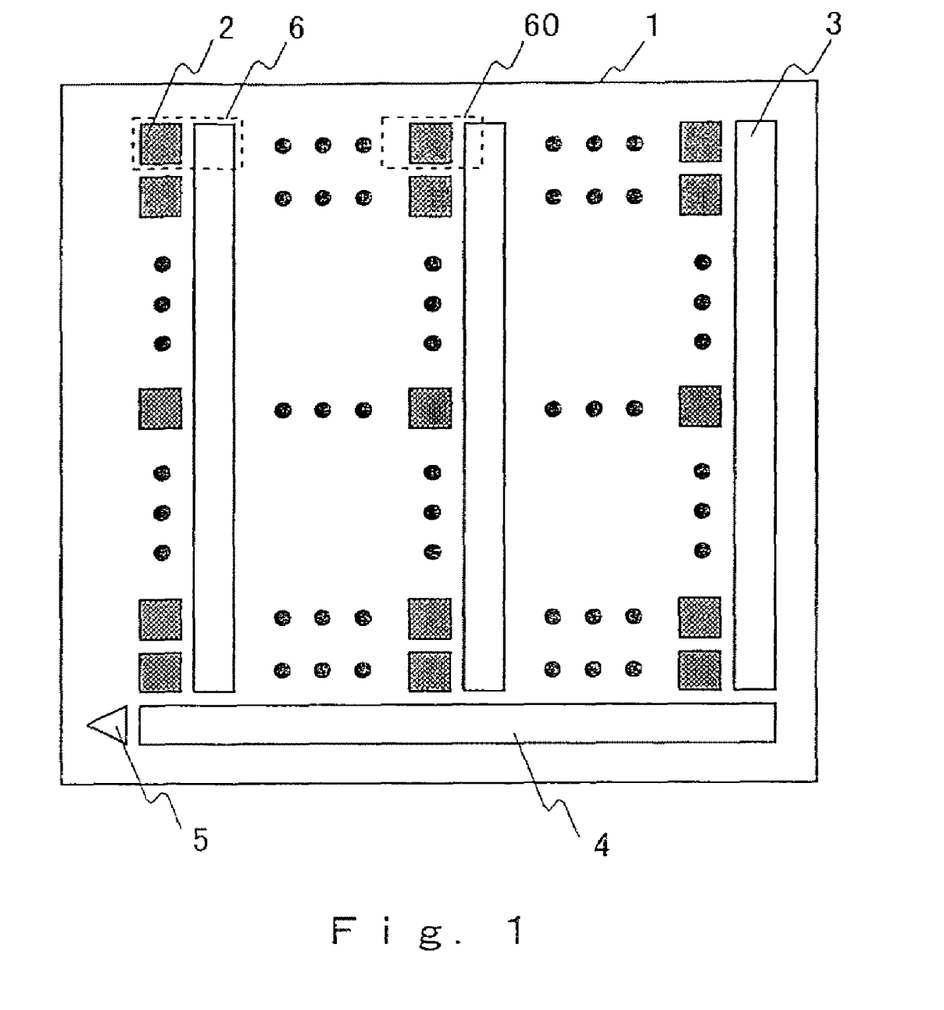
FIG. 1 is a plan view of a solid-state image sensor according to a first embodiment.

A first embodiment of a solid-state image sensor is described in detail, referring to FIGS. 1 and 2. FIG. 1 is a plan view of the solid-state image sensor according to this embodiment. Item 1 is the solid-state image sensor. Items 2 are photoelectric converters, each comprising a respective buried photodiode or the like. Items 3 are vertical CCDs that vertically conduct the electric charges of the signal generated in the photoelectric converters 2. Item 4 is a horizontal CCD that horizontally conducts the electric charges of the signals conducted to it by the vertical CCDs 3. Item 5 is an output amplifier. Items 6 are pixels, and items 60 are pixel units in which light is condensed. A microlens, not shown in FIG. 1, is disposed above each of the photoelectric converters 2 by a planarizing layer.

Each of the pixels 6 comprises a respective photoelectric converter 2 and a respective part of the vertical CCD 3. The multiple pixels 6 are arranged two-dimensionally. Each microlens is disposed with its center aligned with the center of the respective photoelectric converter 2. Hence, the pixel unit 60 is defined as an area in which light is condensed. The pixel unit 60 is shown as having a rectangular shape for easier understanding, but actually the pixel unit 60 has a square shape. In later drawings, the pixel unit 60 is depicted as a square area in which light is condensed.

The electrode for controlling the forward conduction of electric charges by the vertical CCDs 3 includes a first polysilicon electrode (not shown) and a second polysilicon electrode (not shown). These electrodes can be similar to those in a conventional solid-state image sensor of CCD type. Peripheral circuits, etc., for generating driving pulses and the like are included in the solid-state image sensor 1 but are not shown in the drawings since they are not essential parts of the present invention.

It will be understood that solid-state image sensors according to the present invention are not limited to solid-state image sensors of CCD type. Similar benefits can be obtained using alternative embodiments in which the solid-state image sensors are of CMOS type, etc.

Figures 2A, 2B, 2C:
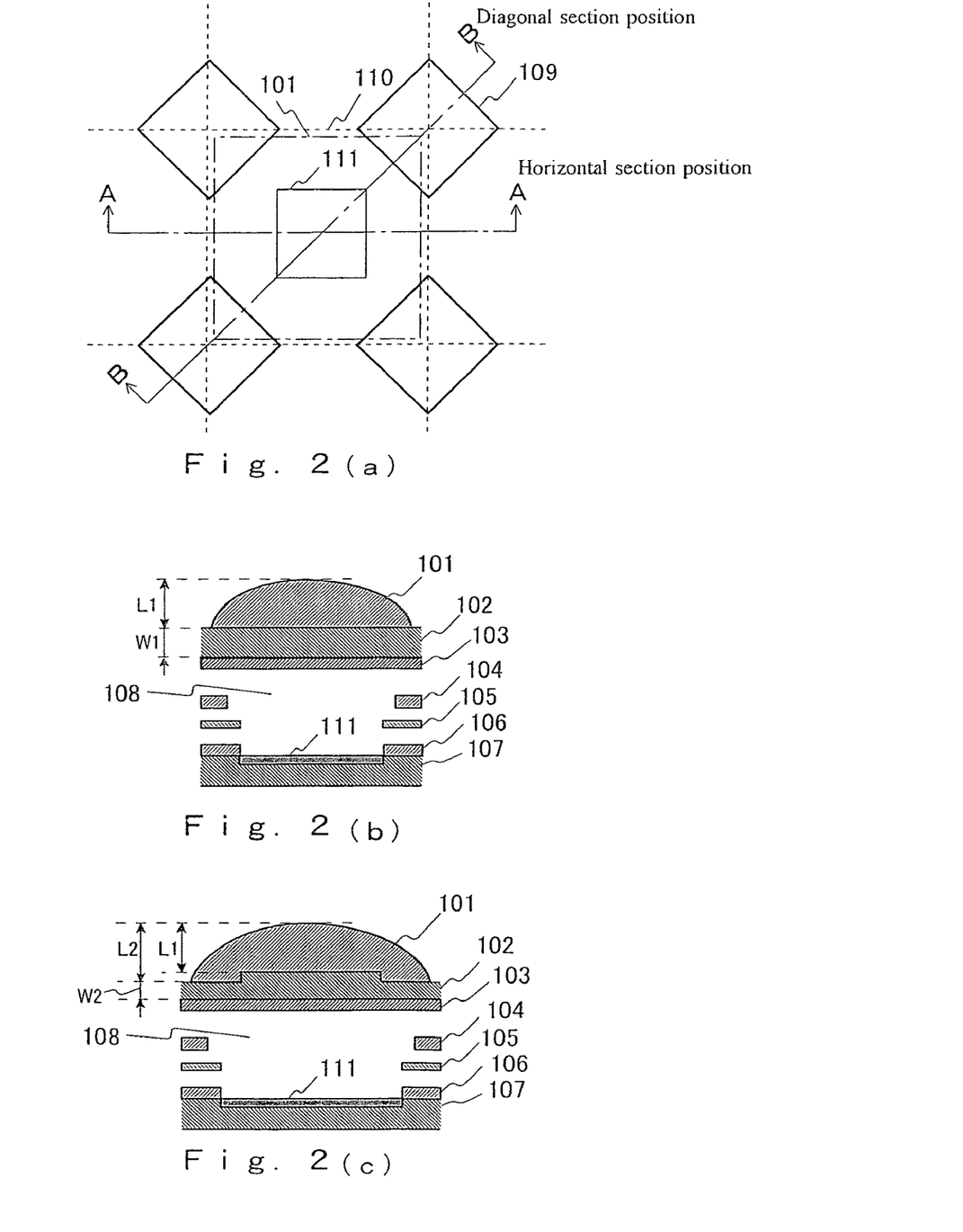
FIG. 2(a) is a plan view of a pixel unit 60 of the image sensor of the first embodiment.
FIGS. 2(b)-2(c) are respective sectional views of the pixel unit 60 of the first embodiment along the lines A-A and B-B, respectively, of FIG. 2(a).

FIGS. 2(*a*)-2(*c*) depict a pixel unit 60 of FIG. 1 in more detail. FIG. 2(*a*) is a plan view of the pixel unit 60; FIG. 2(*b*) is a horizontal section of the pixel unit 60 taken along the line A-A in FIG. 2(*a*); and FIG. 2(*c*) is a diagonal section of the pixel unit 60 taken along the line B-B in FIG. 2(*a*). Item 101 is a microlens. The microlens 101 in this embodiment has a substantially square plan profile; hence, the direct distance from the center of the microlens to the edges thereof is variable. Item 102 is a planarizing layer situated under the microlens 101. Item 103 is a color filter. Item 104 is a shading film serving also as power-supply wiring. Item 105 is wiring. Item 106 is a shading film. Item 107 is a semiconductor substrate. Item 108 is a planarizing layer situated between the photoelectric converter 111 and the color filter 103. Items 109 are respective concave regions of the planarizing layer 102. L1 denotes the maximum thickness of the microlens 101 from regions other than the concave regions 109 of the planarizing layer 102. L2 denotes the maximum thickness of the microlens 101 from the concave regions 109 of the planarizing layer 102. W1 denotes thickness of the planarizing layer 102 in regions other than the concave regions 109, and W2 denotes thickness of the planarizing layer 102 in the concave regions 109.

The bottom portions of the microlens 101 situated at thickness L2 represent "first base regions" of the microlens. These first base regions are located at the four corners (representing n=4 locations, where n is a natural number) of the microlens 101, where the direct distance from the center of the microlens to the respective edges of the microlens is relatively long. The bottom portions of the microlens 101 situated at thickness L1 represent a "second base region" of the microlens. The second base region in this embodiment extends to edges of the microlens situated between the corners, where the direct distance from the center of the microlens to the respective edges is relatively short. Note that the height of the first base regions from the upper surface of the photoelectric converter 111 is less than the height of the second base region from the upper surface of the photoelectric converter.

In the horizontal section A-A shown in FIG. 2(*b*), the microlens 101 works as a lens having thickness L1, but in the diagonal section B-B shown in FIG. 2(*c*), the microlens 101 works as a lens having thickness L2. In the four corners of the planarizing layer 102 and of the microlens 101, the thickness of the planarizing layer 102 is W2, which is less than the thickness W1.

The microlens 101 and the planarizing layer 102 have substantially the same refractive index since the microlens 101 is formed of, e.g., a photoresist and the planarizing layer 102 is formed of, e.g., a resin of the acrylic family. Hence, the microlens 101 and the planarizing layer 102 are effectively an integrated lens.

In FIG. 2(*c*) it can be seen that the planarizing layer 102 is thicker in the middle region compared to the edge regions. The edge regions represent "first regions" of which the direct distance from the center of the microlens (and thus from the center of the planarizing layer) is relatively long. The middle region represents a "second region" that is exclusive of the first regions.

Figure 12A:
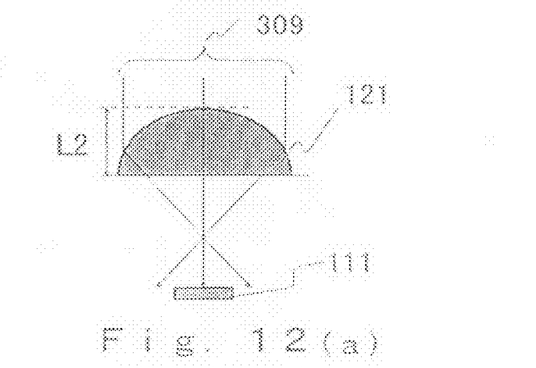
FIGS. 12(a)-12(b) are respective diagrams of optical convergence, along respective sections, achieved using a microlens having comparatively large thickness (small curvature radius).
Figure 12B:
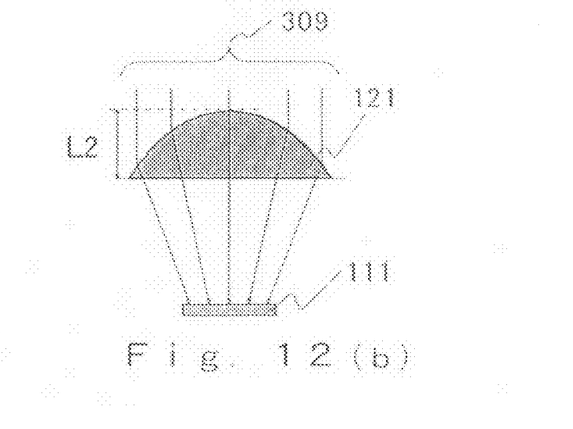

Effects brought about by changing the thickness of the microlens 101 along the horizontal section A-A and along the diagonal section B-B are now discussed with reference to FIGS. 13(*a*)-13(*c*) and 12(*a*)-12(*b*). FIGS. 13(*b*)-13(*c*) depict a conventional microlens 701 having the same lens thickness L1 and similar profiles in both sections A-A and B-B, respectively. Also shown in FIGS. 13(*b*)-13(*c*) is the optical condensing (convergence) behavior of the microlens 701. In FIGS. 12(*a*)-12(*b*), the optical convergence behavior of a microlens 121, having the same lens thickness L2 in both sections A-A and B-B, respectively, is shown. Note that L2 is greater than L1. In FIGS. 12(*a*)-12(*b*) depicted components that are the same as respective components shown in FIGS. 13(*a*)-13(*c*) have the same reference numerals.

In the conventional pixel, providing the microlens 701 with the thickness L1 in the section A-A to provide efficient optical convergence, as shown in FIG. 13(*b*), reduces the convergence efficiency provided by the diagonal section B-B shown in FIG. 13(*c*). But, as shown in FIG. 12(*b*), increasing the thickness of the microlens 121 from L1 to L2 to achieve efficient convergence behavior by the diagonal section B-B reduces the curvature radius too much to provide good optical convergence by the horizontal section A-A in FIG. 12(*a*). Thus, it is impossible using only these measures to condense incoming light 309 fully on the photoelectric converter 111.

In the first embodiment, in contrast, the microlens 102 along the horizontal section A-A of FIG. 2(*a*) works as the microlens 701 in FIG. 13(*b*) having thickness L1; along the diagonal section B-B of FIG. 2(*a*) the microlens 102 works as the microlens 121 in FIG. 12(*b*) having thickness L2. Thus, this embodiment provides good optical convergence along both the horizontal section A-A and the diagonal section B-B.

Figures 3A, 3B:
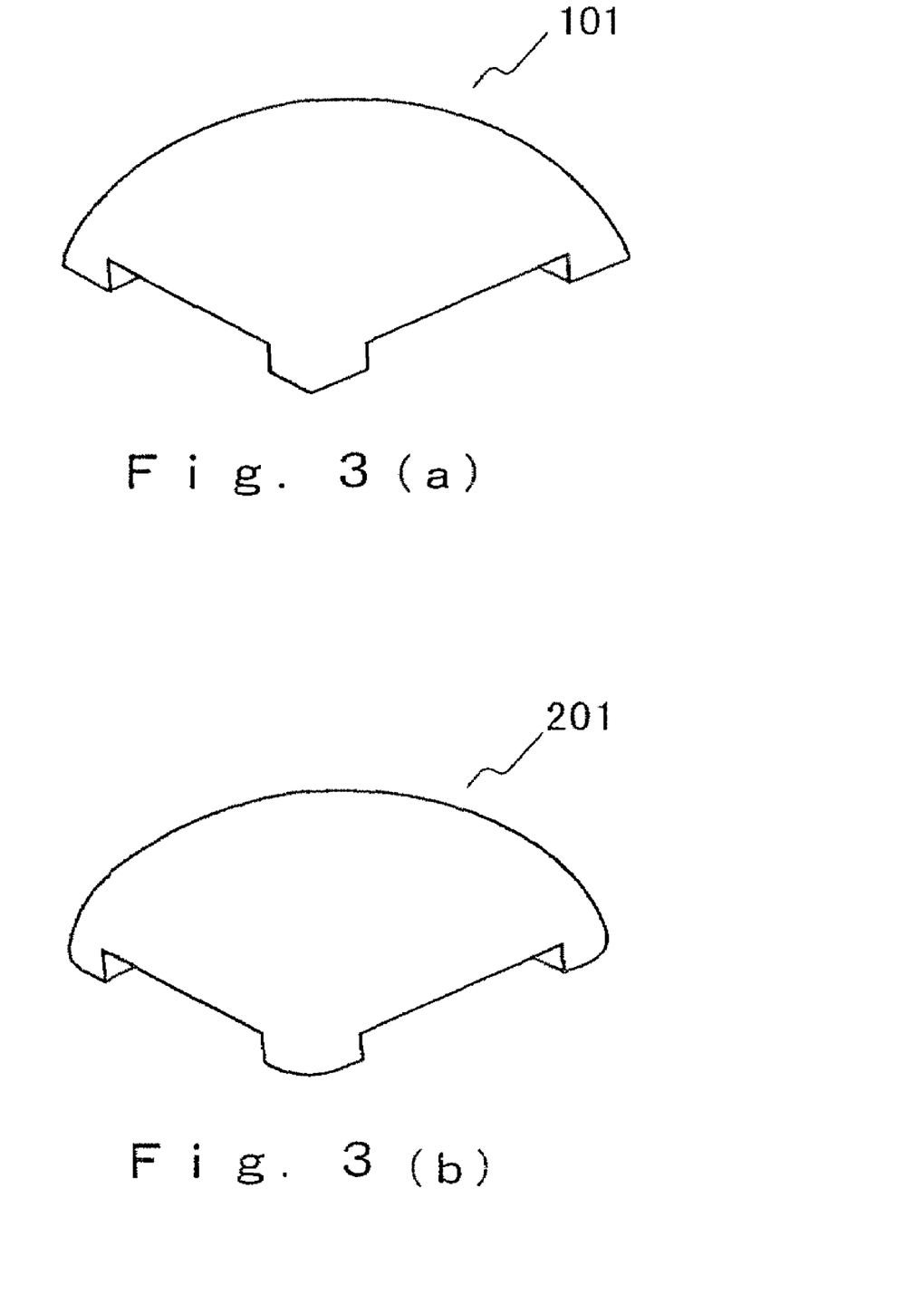
FIGS. 3(a)-3(b) are perspective views of respective shapes of the microlens of the first embodiment.

The shape of a microlens 101 of this embodiment is shown in perspective view in FIG. 3(*a*). The microlens 201 in FIG. 3(*b*), which is a modification of the microlens 101 of FIG. 3(*a*), is made by rounding the four corners of the microlens 101. The lens effect near the four corners, whether sharp or rounded, is substantially the same in both configurations 201, 101. Note that the "first base regions" are located beneath the four corners, and the "second base region" is located between the corners.

The planarizing layer 102 of this embodiment has a bi-level structure with thicknesses W1 and W2. The same bilevel effect can be obtained either by the planarizing layer 102 having a multi-level structure or by the planarizing layer 102 having continuous inclinations. These shapes can be realized by a conventional processing method such as etching. For example, in a first method, a single planarizing layer 102 having a thickness W1 is formed. Then, while the center region of the planarizing layer is masked, certain peripheral regions thereof are removed by etching or the like to form "low-level" (concave) regions. This sequence is repeated as required to provide the planarizing layer 102 with a desired multi-level structure. Instead of forming the planarizing layer 102 as a single thick layer, multiple thin planarizing layers can be formed at respective levels to accumulate the layers into the desired shape for the planarizing layer, including low-level regions.

After forming the planarizing layer, the microlens 101 is formed. In the first embodiment, the planarizing layer 102 is formed having the thicknesses W1 and W2. Then, a layer of photoresist or the like, serving as a base material of the microlens 101, is formed on the planarizing layer 102 and heated to achieve reflow. By reflow, a portion of the photoresist or the like flows down and enters the low-level regions, having thickness W2, of the planarizing layer 102, thereby forming the microlens 101.

With solid-state image sensors of this embodiment, even when the shape of a pixel is quadrangular, the light-convergence efficiency in the four corners of each pixel is improved over conventional sensors. As a result, more light passing through the microlens is incident on the photoelectric converter of the pixel, which increases the signal output from the photoelectric converters without having to increase the amount of light on the pixel. This results in improved sensitivity of the solid-state image sensor.

Second Embodiment

Figure 4A:
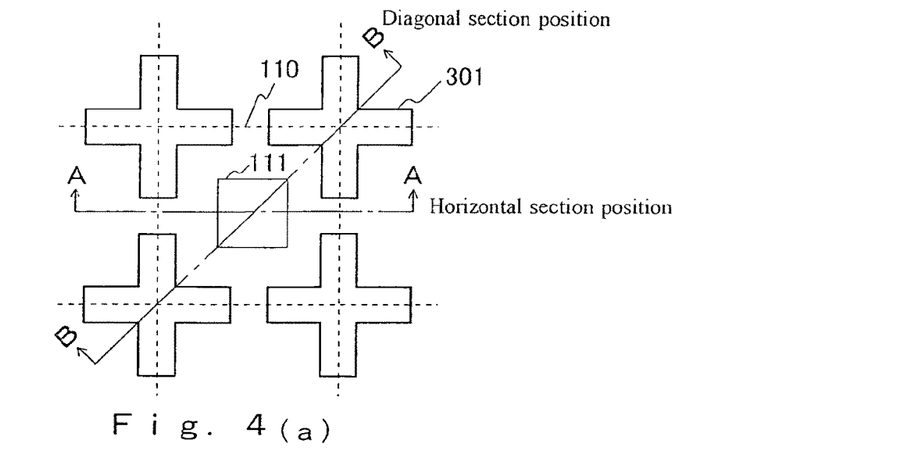
FIG. 4(a) is a plan view of a pixel unit 60 of the image sensor of the second embodiment.
Figure 4B:
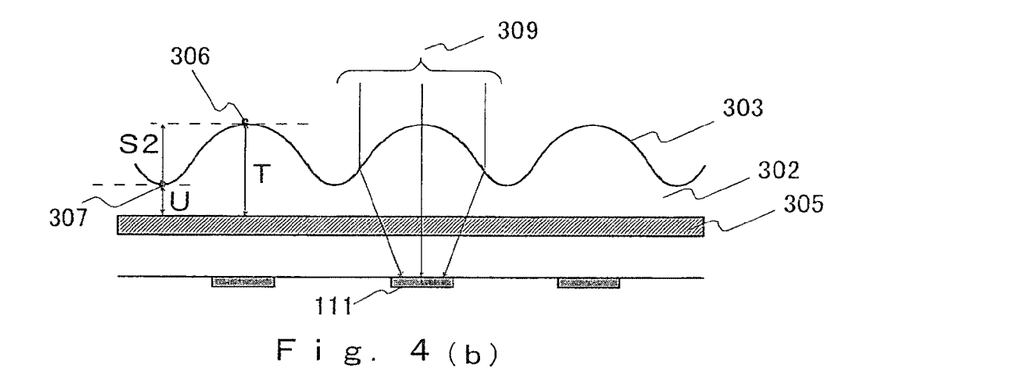
FIGS. 4(b)-4(c) are respective sectional views, along the lines A-A and B-B, respectively, of FIG. 4(a), of the pixel unit 60 of the second embodiment
Figure 4C:
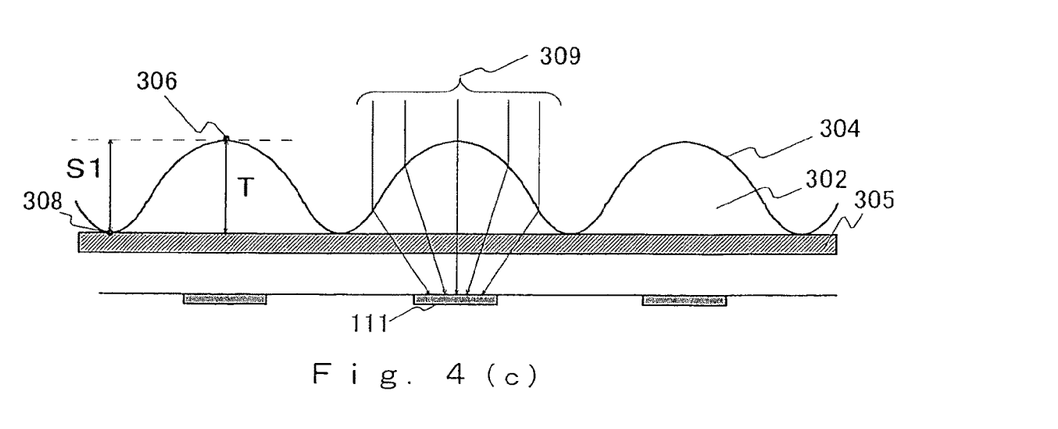

A second embodiment of a solid-state image sensor is shown in FIGS. 4(a)-4(c). FIG. 4(a) is a plan view of a pixel unit 60 of the solid-state image sensor of this embodiment. FIG. 4(b) is a horizontal section along the line A-A of FIG. 4(a), and FIG. 4(c) is a diagonal section along the line B-B of FIG. 4(a). Each pixel unit 60 comprises a microlens 302. Items 301 are concave regions (to be described in detail below with reference to FIGS. 5(a)-5(c)). Item 303 is the profile of the microlens 302 along the horizontal section A-A, and item 304 is the profile of the microlens 302 along the diagonal section B-B. Item 305 is a planarizing layer. Point 306 is the apex of the microlens 302, point 307 is the lowest point on the horizontal lens shape 303, and point 308 is the lowest point on the diagonal-section profile 304. "T" denotes the maximum thickness of the microlens 302 from the surface of the planarizing layer 305. S1 denotes the thickness difference between the lowest point 308 and the apex 306 of the diagonal section profile 304, and S2 denotes the thickness difference between the lowest point 307 and the apex 306 of the horizontal section profile 303. "U" denotes minimum thickness of the microlens 302 from the surface of the planarizing layer 305 to the lowest point 307. Incidentally, a color filter, shading films, wiring, and so on are omitted in FIGS. 4(a)-4(c) to simplify the description.

As shown in FIG. 4(b), along the horizontal section A-A, the microlens 302 has a thickness S2 that is less than the thickness S1. As shown in FIG. 4(c), along the diagonal section B-B, the microlens 302 has a thickness S1 that is greater than the thickness S2. That is, along the horizontal section A-A, the microlens 302 works as a lens having the horizontal section (and lesser thickness L1) of the microlens 701 in FIG. 13(b); along the diagonal section B-B, the microlens 302 works as a lens having the diagonal section (and greater thickness L2) of the microlens 121 in FIG. 12(b). Hence, good optical convergence is realized, as shown in FIG. 13(b) and FIG. 12(b), along both the horizontal section A-A and the diagonal section B-B.

Figure 5A:
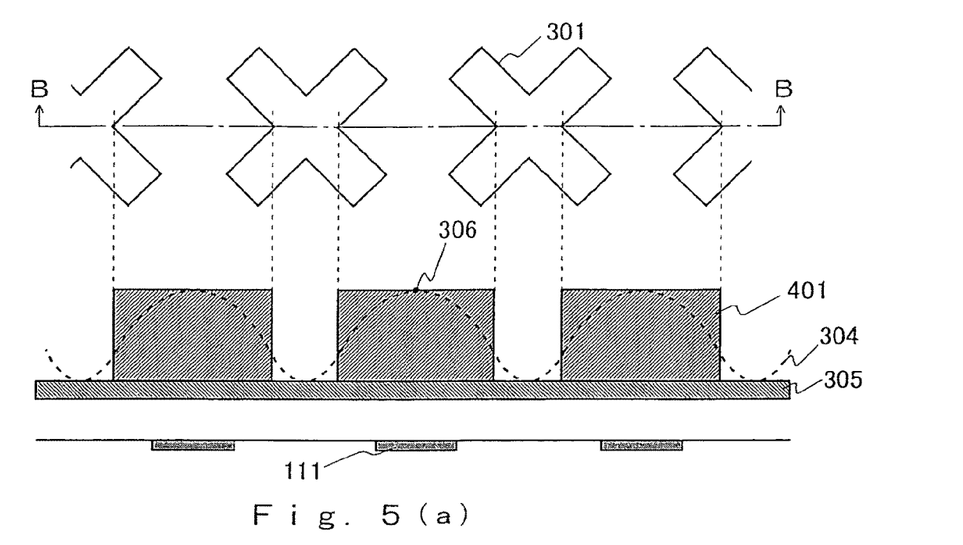
FIGS. 5(a)-5(c) are respective views, along the line B-B, depicting the results of certain steps in an embodiment of a method for manufacturing the microlens used in the second embodiment.
Figure 5B:
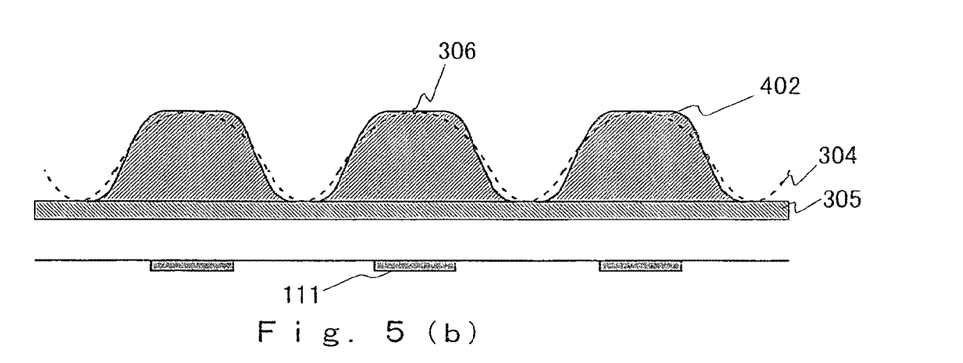
Figure 5C:
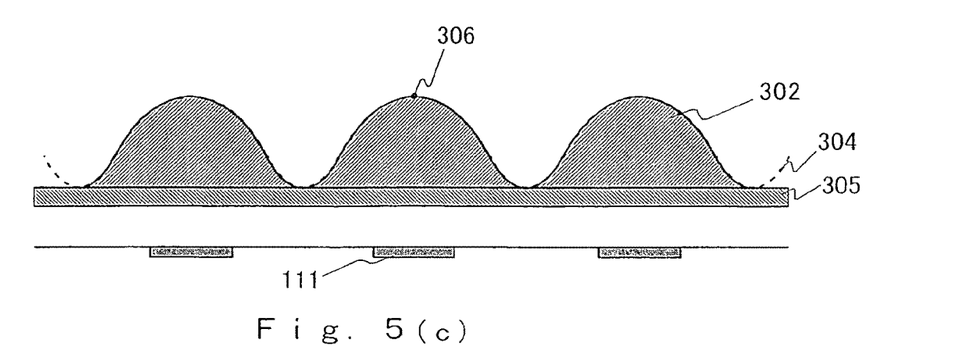

A method for making the microlens 302, having the desired horizontal section profile 303 and diagonal section profile 304, is shown in FIGS. 4(b) and 4(c) and is described below with reference to FIGS. 5, 6, and 7. FIGS. 5(a)-5(c) are respective views of the manner of forming the diagonal-section profile 304 (along the diagonal section B-B of FIG. 4(c)). In FIG. 5(a) the configuration and locations of the photoresist layer 401, as initially deposited for subsequent formation of the microlens 302, are shown in an easily understandable and contrasting (shaded) manner, relative to the section B-B. I.e., the photoresist 401 is applied in regions around the apices 306 of the desired diagonal section profile 304 of the microlens, but no photoresist 401 is applied in the concave regions 301. Applying heat softens the photoresist layer 401 by "reflow" so that the corner portions of the photoresist begin to flow downward into the concave regions, resulting in the photoresist profile 402 shown in FIG. 5(b) (depicting a horizontal section along the line B-B in FIG. 5(a)). With further application of heat, more reflow occurs, causing more photoresist to flow downward into the concave regions 301. This further reflow produces microlenses 302 having the diagonal-section profile 304 shown in FIG. 5(c). It should be noted that these explanatory views (FIGS. 5(a)-5(c)) depict respective situations in a schematic and easily understandable manner, and do not literally depict actual downward flow and so on.

Figure 6A:
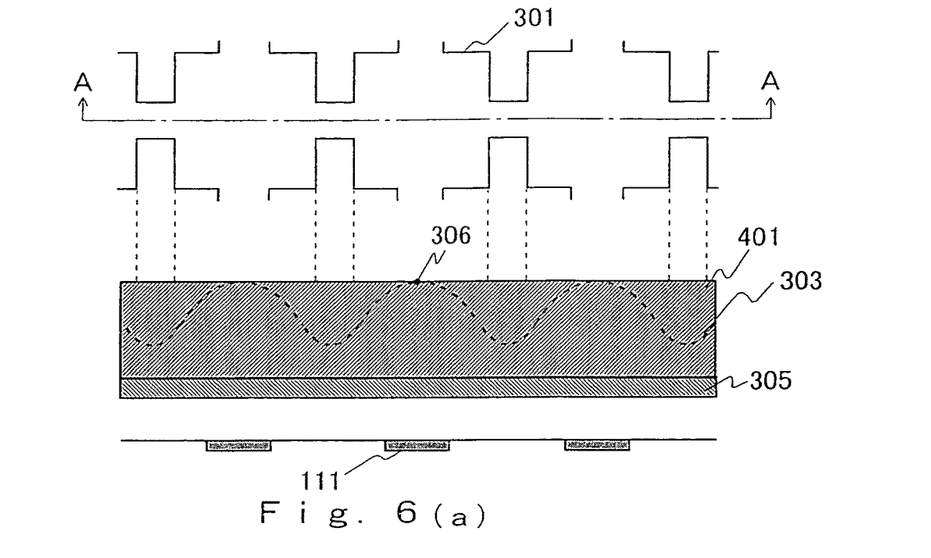
FIGS. 6(a)-6(c) are respective views, along the line A-A, depicting the results of certain other steps in an embodiment of a method for manufacturing the microlens used in the second embodiment.
Figure 6B:
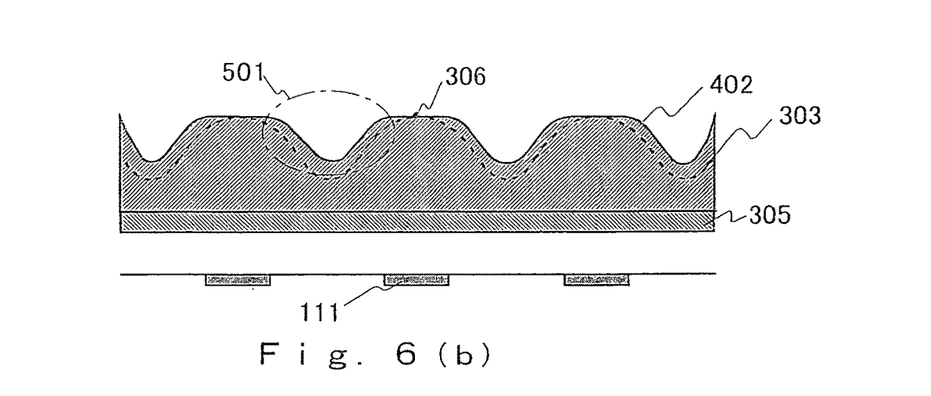
Figure 6C:
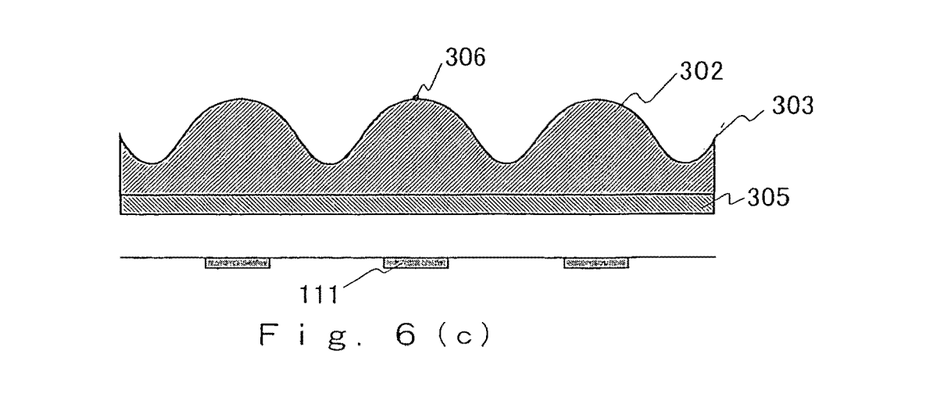

FIGS. 6(a)-6(c) depict the results of the same process as described with reference to FIGS. 5(a)-5(c), but along the horizontal section A-A instead of the diagonal section B-B. The desired horizontal-section profile of the microlens is denoted by 303 (as viewed along the horizontal section A-A in FIG. 4(b)). FIG. 6(a) shows the configuration of the applied photoresist layer 401 as viewed along the horizontal section A-A. For ease of understanding, the photoresist layer 401 is depicted in a contrasting (shaded) manner. Since the photoresist layer 401 along the horizontal section A-A does not include concave regions 301, its thickness as formed along this profile is uniform, without any concavities. Applying heat to achieve reflow of the photoresist layer 401 causes the photoresist located within regions exemplified by the dashed-line ellipse 501 (only one ellipse is shown, but the others will be understood) becomes gradually indented, as indicated by the horizontal-section profile 402.

Figure 7A:
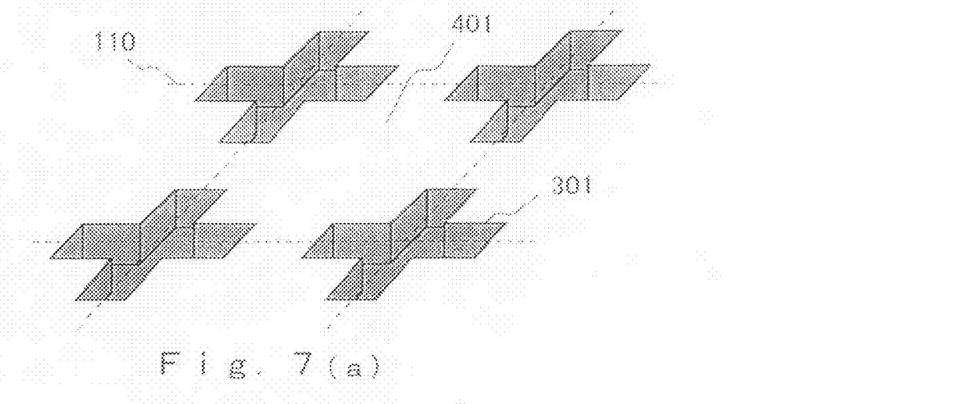
FIGS. 7(a)-7(c) are respective perspective views depicting reflow of photoresist as achieved in an embodiment of a method for manufacturing the microlens used in the second embodiment.
Figure 7B:
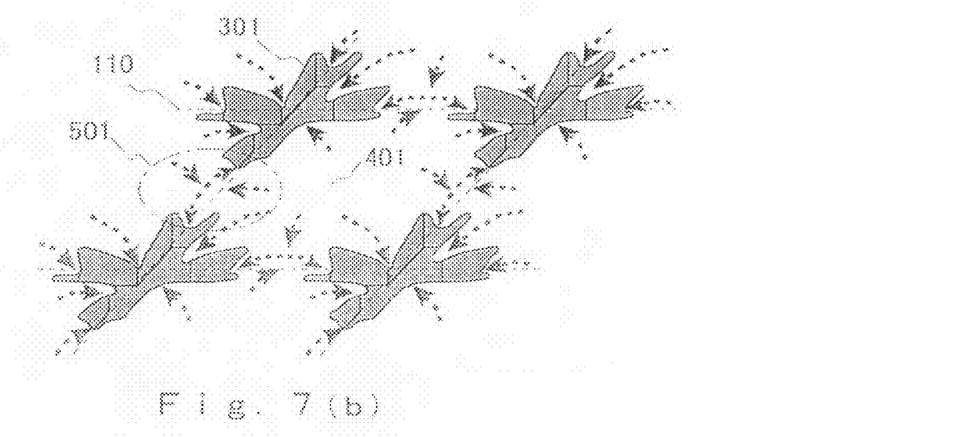
Figure 7C:
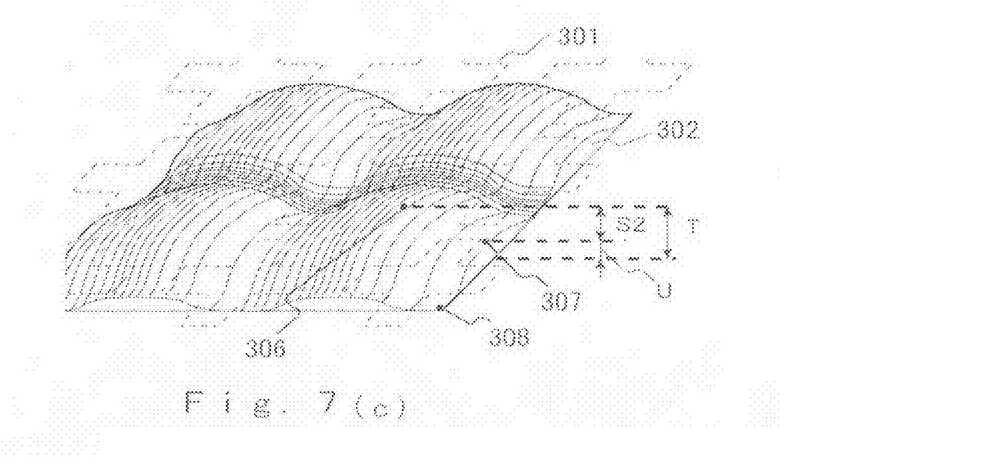

Reference is now made to FIGS. 7(a)-7(c), which schematically depict the photoresist undergoing reflow into the concave regions 301. Before reflow, the concave regions 301 have geometric corners and sides (as achieved by etching or the like), as shown in FIG. 7(a). Applying heat to cause reflow softens the photoresist 401, causing the corners of the photoresist to flow downward into the concave regions and become rounded in the manner denoted by dashed arrows in FIG. 7(b). As a result, each portion of the photoresist within the dashed-line ellipse 501 in FIG. 7(b) begins to be indented, being pulled by reflow into the concave regions 301 on both sides.

With further application of heat, reflow causes gradual filling of the concave regions 301 by the photoresist, yielding the microlens 302 having the desired horizontal-section profile 303 shown in FIG. 6(c). This situation is shown in FIG. 7(c), which shows the microlens surface in wireframe. Along the horizontal section A-A, reflow does not make the lens bottom completely flat relative to the maximum thickness T of the lens apices 306. At the lowest points 307 of the horizontal-section profile 303, the thickness is greater than the thickness of the four corner portions (which are the lowest points 308 of the diagonal section profile 304) by the thickness U at the lowest points 307. Thus, the microlens works as a lens having thickness S2.

The thickness of the microlens 302 along the horizontal section A-A and the thickness of the microlens 302 along the diagonal section B-B are different. The microlens 302 along the horizontal section A-A works as a thin lens having the thickness L1 of the microlens 701 shown in FIG. 13(b). The microlens 302 along the diagonal section B-B works as a thick lens having the thickness L2 of the microlens 121 shown in FIG. 12(b). Hence, it is possible to realize good optical condensing behavior, as shown in FIGS. 13(b) and 12(b), both along the horizontal section A-A and along the diagonal section B-B.

Third Embodiment

Figure 8A:
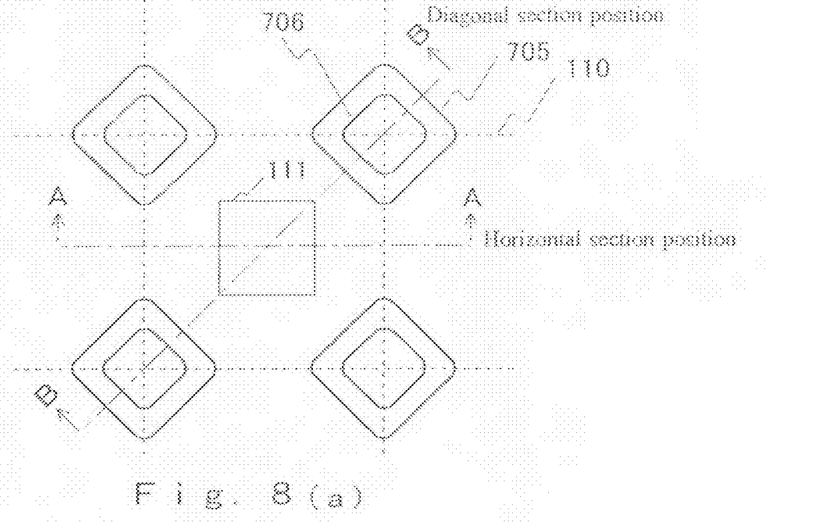
FIG. 8(a) is a plan view of a pixel unit 60 of the image sensor of the third embodiment.
Figure 8B:
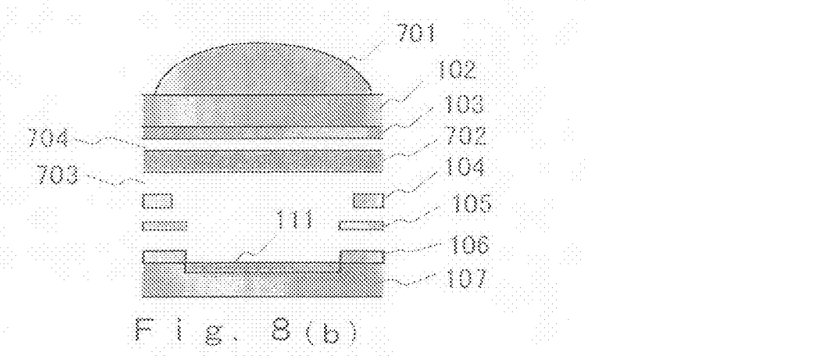
FIGS. 8(b)-8(c) are respective sectional views, along the lines A-A and B-B, respectively, of FIG. 8(a), of the pixel unit 60 of the third embodiment.

A third embodiment of the solid-state image sensor is described with reference to FIGS. 8(a)-8(c). FIG. 8(a) is a plan view of a pixel unit 60 of the solid-state image sensor; FIG. 8(b) is a horizontal section of the pixel unit 60 along the line A-A in FIG. 8(a); and FIG. 8(c) is a diagonal section of the pixel unit 60 along the line B-B in FIG. 8(a).

Figure 8C:
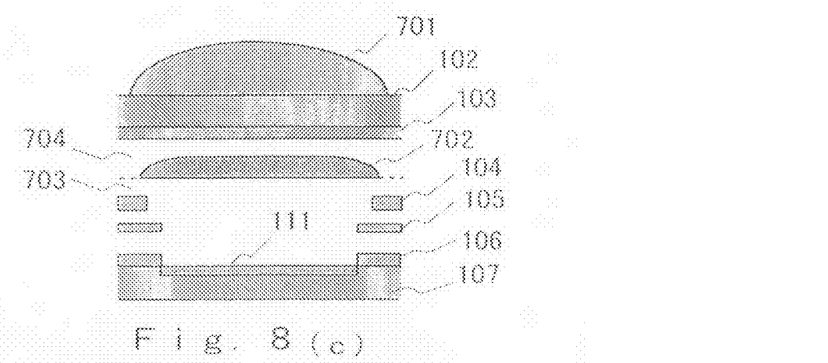

In FIGS. 8(b)-8(c), item 701 is a microlens, and item 702 is a second lens. The microlens 701 and second lens 702 are coaxial with respect to their optical axes. Items 703 and 704 are respective planarizing layers. In FIG. 8(a) items 705 are inclined regions (to be described in detail later) of the second lens 702, and items 706 are concave regions (to be described in detail later) of the second lens 702. Components having the same reference numerals as respective components described in the first and second embodiments described above have the same respective functions. Hence, detailed description of such components is omitted below. Note that the second lens 702 is substantially parallel to the photoelectric converter 111. Also, as with the microlens 701, the direct distance from the center of the second lens 702 to the edges of the second lens is variable. The second lens 702 desirably is made of a material having a higher refractive index than the material of which the planarizing layer 703 is made.

In FIGS. 8(a)-8(c), the depicted microlens 701 is a quadrangular microlens molded to achieve, along the horizontal section A-A, efficient condensation of light on the photoelectric converter 111 (FIG. 13(b)). The question is then raised as to whether there is any problem with condensing light along the diagonal section B-B; if such a problem exists, there would be insufficient optical condensing in the vicinity of the four corners of the photoelectric converter 111 (FIG. 13(c)).

In FIGS. 8(a)-8(c), the planarizing layers 703 and 704 are formed of, for example, silicon oxide or the like and have a refractive index of about 1.5. The second lens 702 is formed of, for example, silicon nitride, which has a different refractive index (about 2) than silicon oxide. Thus, the second lens 702 works as a lens. The desired shape of the second lens 702 is formed using a general processing method such as etching.

Figures 9A, 9B:
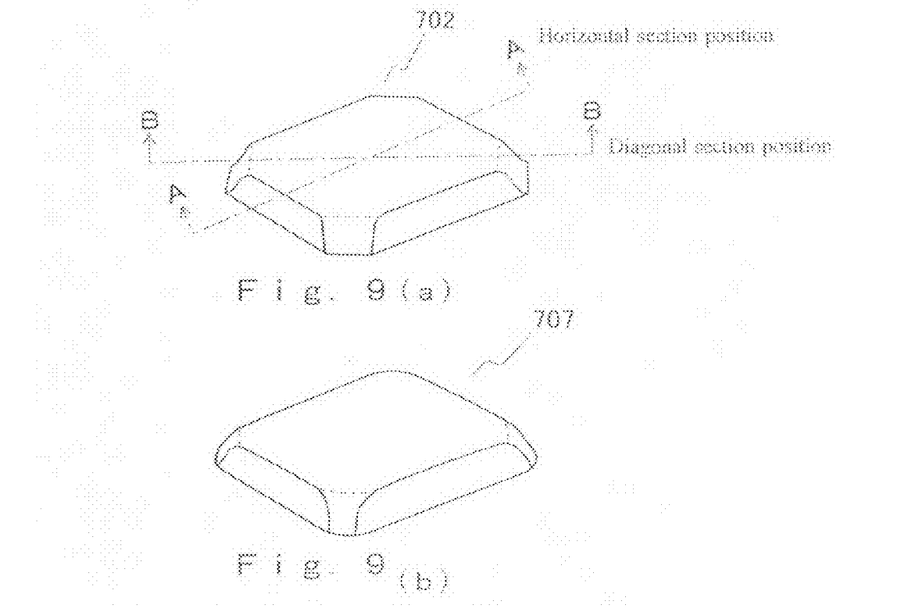
FIGS. 9(a)-9(b) are perspective views showing respective shapes of the second lens in the third embodiment.

The shape of the second lens 702 is achieved as described below, with reference to FIGS. 9(a)-9(b) and 10(a)-10(b). FIG. 9(a) is a perspective view of the second lens 702. Along the horizontal section A-A the second lens 702 does not vary in thickness and is substantially planar. But, along the diagonal section B-B the second lens has inclinations at the corners. These corners exhibit lens effects. The corners of the second lens represent "first regions" that are located near n positions (n being a natural number, wherein n=4 in a quadrangular plan profile) of the edge of the second lens. At these first regions the direct distance from the center of the second lens is relatively long. A "second region" of the second lens 702 encompasses regions not including the first regions. As can be seen in FIGS. 9(a) and 9(b), the second lens 702 in this embodiment becomes thinner from the second region to the first regions.

Figures 10A, 10B:
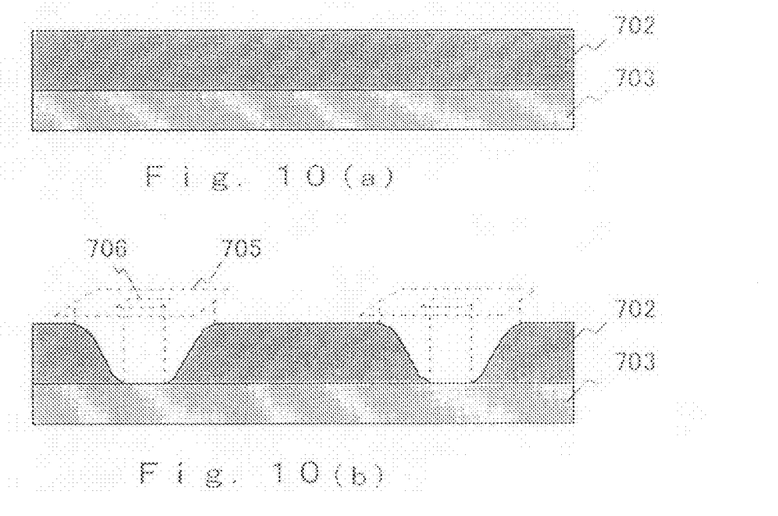
FIGS. 10(a)-10(b) are views, along the lines A-A and B-B, respectively, of FIG. 9(a), showing respective sectional profiles of the second lens in the third embodiment.

A sectional view of the second lens 702 along the horizontal section A-A in FIG. 9(a) is shown in FIG. 10(a), and a sectional view of the second lens 702 along the diagonal section B-B in FIG. 9(a) is shown in FIG. 10(b). In FIG. 10(a) the second lens 702 is formed on the planarizing layer 703; but, in this profile, the second lens 702 is flat and does not function as a lens. That is, along the horizontal section A-A, only the microlens 701 contributes to optical convergence on the photoelectric converter 111. Hence, efficient optical condensing in the photoelectric converter 111 is made possible as shown in FIG. 13(b).

In FIG. 10(b), the second lens 702 is formed on the planarizing layer 703. But, material of the second lens 702 is not present in the concave regions 706. In the inclined regions 705, excluding the concave regions 706 in FIGS. 8(a)-8(c), the material of the second lens 702 is sloped and gradually thins toward the concave regions 706. That is, the second lens 702 exhibits lens effects only near the sloped four corners, even though its regions excluding the concave regions 706 and the inclined regions 705 are substantially flat and thus have almost no lens effect.

Figure 11:
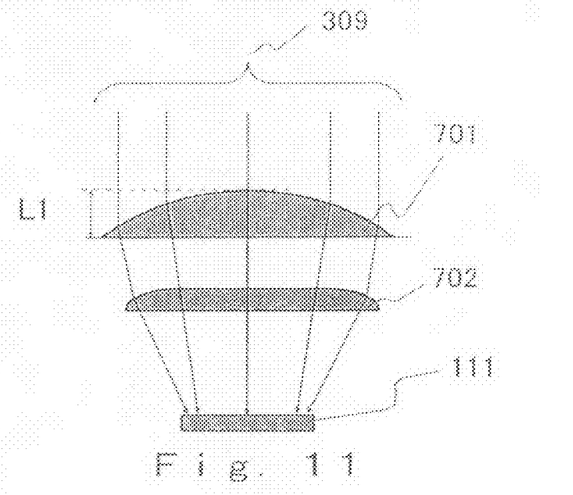
FIG. 11 is a diagram showing optical convergence being performed by the third embodiment.

As described above, along the diagonal section B-B, the optical condensing by the microlens 701 and optical condensing by the lens effects of the four corner portions of the second lens 702 contribute to optical convergence on the photoelectric converter 111. Hence, using only the microlens 701, efficient optical condensing in the four corner portions of the photoelectric converter 111 is not possible, as shown in FIG. 13(c). But, this deficiency is corrected by the lens effects of the four corner portions of the second lens 702. This results in two-stage optical condensing as shown in FIG. 11, which enables efficient optical condensing on the photoelectric converter 111.

Incidentally, the second lens 702 of the third embodiment has a shape in which the four corners are cut off along direct distances as shown in FIG. 9(a). Alternatively, the second lens 702 can have a shape with rounded corners as shown in FIG. 9(b) while exhibiting the same lens effect near the four corners, and thus can provide the same optical convergence effect as that described above.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to exact construction and operation illustrated and described herein, and accordingly all suitable modifications and equivalents may be resorted to, falling within the scope thereof.

What is claimed is:

1. A solid-state image sensor, comprising:
a pixel on a semiconductor substrate;
a photoelectric converter provided in the pixel to convert incident light to an electric signal; and
a microlens situated above the photoelectric converter,
wherein the microlens has a plan profile in which a direct distance from a center of the microlens to a lens edge differs with different respective angles, in the plan profile, from the center to the lens edge;
the microlens having a bottom portion, where the bottom portion comprises a first base region and a second base region not including the first base region, the first base region being situated at locations near the lens edge, from which the direct distance is relatively long; and
a vertical height of the first base region from an upper surface of the photoelectric converter is less than a vertical height of the second base region from the upper surface of the photoelectric converter.

2. The solid-state image sensor according to claim 1, wherein the vertical height from the upper surface of the photoelectric converter decreases stepwise from the second base region toward the first base region.

3. The solid-state image sensor according to claim 1, wherein the vertical height from the upper surface of the photoelectric converter continuously decreases from the second base region to the first base region.

4. A solid-state image sensor, comprising:
a pixel formed on a semiconductor substrate;
a photoelectric converter provided in the pixel to convert incident light to an electric signal;

a planarizing layer situated above the photoelectric converter; and a microlens situated on the planarizing layer, wherein the microlens has a square-shaped plan profile with rounded corners, and wherein a direct distance from a center of the microlens to an edge of the microlens differs with different respective angles, in the plan profile, from the center to the lens edge;

the planarizing layer has a first region and a second region not including the first region, the first region being provided at respective locations near the four corners, from which the direct distance is relatively long in the plan profile of the microlens as vertically projected on the planarizing layer; and a thickness of the planarizing layer is greater in the second region toward a microlens side than in the first region.

5. The solid-state image sensor according to claim 4, wherein the thickness of the planarizing layer decreases stepwise from the second region toward the first region.

6. The solid-state image sensor according to claim 4, wherein the thickness of the planarizing layer continuously decreases from the second region toward the first region.

7. A solid-state image sensor, comprising:

a pixel situated on a semiconductor substrate;

a photoelectric converter provided in said pixel to convert incident light to an electric signal;

a planarizing layer situated above the photoelectric converter; and a microlens situated on the planarizing layer, wherein the microlens has a plan profile in which a direct distance from a center of the microlens to a lens edge differs with different respective angles, in the plan profile, from the center to the lens edge, in said planarizing layer, a second lens is provided parallel to the photoelectric converter, with an optical axis of the second lens being aligned with an optical axis of the microlens, the second lens has a plan profile in which a direct distance from a center of the second lens to a lens edge differs with different respective angles, in the plan profile, from the center to the lens edge, the second lens being made of a member having a greater refractive index than the planarizing layer, and the plan profile being a square with rounded corners, the second lens has a first region and a second region not including the first region, wherein the first region is located near the lens edge from which the direct distance is relatively long, and the second lens is sloped so as to become progressively thinner from the second region to the first region.

8. The solid-state image sensor according to claim 7, wherein:

the second region is planar; and the first region in the second lens is sloped so as to have reduced thickness from portions adjacent to the second region toward the lens edge in the first region.

9. A solid-state image sensor, comprising:

a pixel formed on a semiconductor substrate;

a photoelectric converter provided in the pixel to convert incident light to an electric signal;

a planarizing layer situated above the photoelectric converter; and a microlens situated on the planarizing layer, wherein the microlens has a plan profile in which a direct distance from a center of the microlens to an edge of the microlens differs with different respective angles, in the plan profile, from the center to the lens edge;

the planarizing layer has a first region and a second region not including the first region, the first region being provided at respective locations on the edge, from which the direct distance is relatively long in the plan profile of the microlens as vertically projected on the planarizing layer; and a thickness of the planarizing layer is greater in the second region toward a microlens side than in the first region and continuously decreases from the second region toward the first region.

* * * * *